United States Patent [19]

Tanaka et al.

[11] Patent Number: 4,956,680
[45] Date of Patent: Sep. 11, 1990

[54] THIN FILM TRANSISTOR

[75] Inventors: Hideo Tanaka; Shunichi Motte, both of Tokyo, Japan

[73] Assignee: Seiko Instruments Inc., Japan

[21] Appl. No.: 132,406

[22] Filed: Dec. 14, 1987

[30] Foreign Application Priority Data

Dec. 22, 1986 [JP] Japan .................. 61-305708

[51] Int. Cl.$^5$ .......................................... H01L 27/12
[52] U.S. Cl. ........................................ 357/4; 357/23.7
[58] Field of Search ............................. 357/4, 2, 23.7

[56] References Cited

U.S. PATENT DOCUMENTS 3,969,751  7/1976  Drukaroff et al. ............. 357/30 L
4,609,930  9/1986  Yamazaki ........................... 357/4
4,715,930  12/1987  Diem ................................. 357/4
4,764,450  8/1988  Ruckert et al. ................... 430/191

FOREIGN PATENT DOCUMENTS 61-145870  7/1986  Japan ................................ 357/4
61-244068  10/1986  Japan ............................... 357/4
61-280659  12/1986  Japan ............................. 357/30 L Primary Examiner—Andrew J. James
Assistant Examiner—Mark Prenty
Attorney, Agent, or Firm—Bruce L. Adams; Van C. Wilks

[57] ABSTRACT

A thin film transistor having a shading layer for reducing optical leakage current. The shading layer is made essentially of opaque organic material.

10 Claims, 2 Drawing Sheets

THIN FILM TRANSISTOR

BACKGROUND OF THE INVENTION

This invention relates to a thin film transistor (hereinafter referred to as "TFT") used for driving a liquid crystal panel or the like.

TFTs not having a light-shielding film such as shown in FIG. 2 with gate, source and drain electrodes 9, 10, 11 and TFTs having a light-shielding film are known in the art. In TFTs not having a light-shielding film, the thickness of an amorphous semiconductor is reduced down to about 500 Å in order to reduce optical leakage current. According to this method, however, the optical leakage current can be reduced down to about $1.0 \times 10^{-9}$ A. In conventional TFTs having a light-shielding film, on the other hand, the light-shielding film consists of an amorphous insulating film using germanium as its principal component. Therefore, the fabrication process of the light-shielding film is complicated and moreover, germane or monosilane as the starting gas is toxic to a human body.

SUMMARY OF THE INVENTION

It is therefore an object of the invention to provide a new TFT having a light-shielding film for reducing an optical leakage current of the TFT.

It is another object of the invention to provide a method of manufacturing a TFT having a light-shielding film.

DETAILED DESCRIPTION OF THE INVENTION

To solve the problems described above, the present invention uses an opaque organic photoresist material containing black carbon as the light-shielding film.

In a TFT having a structure such as the structure of the present invention, the light-shielding film is formed in exactly the same way as patterning of a photoresist and moreover, provides a light-shielding effect substantially equal to that of the conventional light-shielding film.

Figure 1:
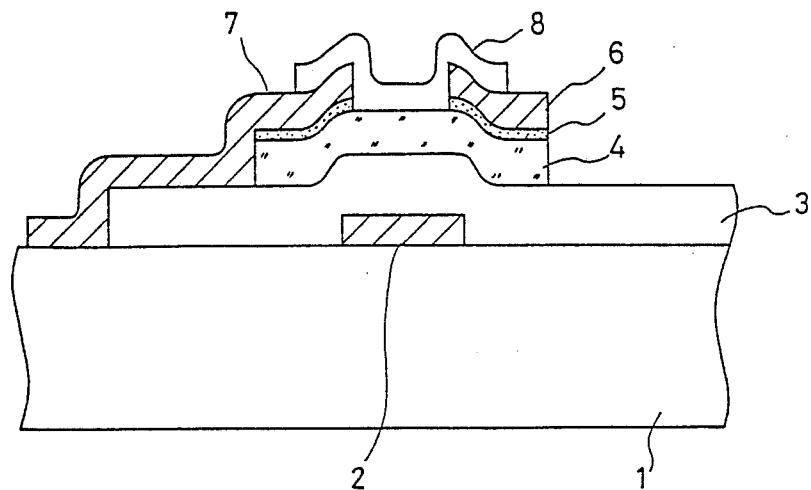
FIG. 1 is a sectional structural view of a TFT having a light-shielding film in accordance with the present invention.
Figure 2:
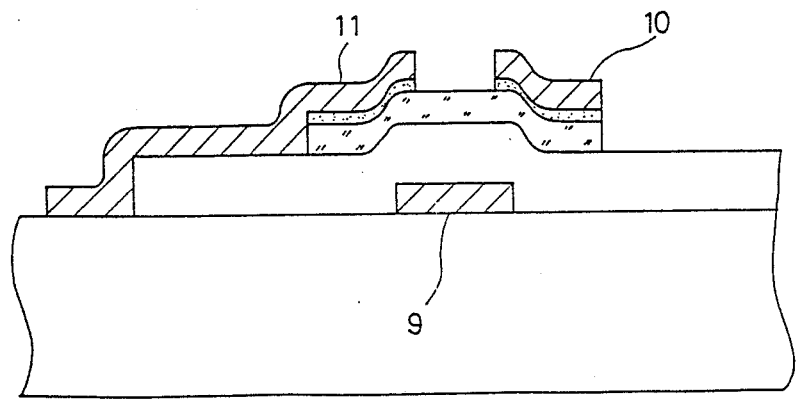
FIG. 2 is a sectional structural view of a TFT not having a light-shielding film.

FIG. 1 is a sectional structural view of a TFT in accordance with the present invention. In FIG. 1, reference numeral 1 represents an insulating substrate, which is made of quartz, glass, ceramics, or the like. Reference numeral 2 represents a gate electrode, which is made of chromium, aluminum, ITO, or the like. Reference numeral 3 represents a gate insulating film having a thickness of 0.1 to 0.3 $\mu$m, which is made of silicon nitride, silicon dioxide, silicon nitride containing flourine, or the like. Reference numeral 4 represents an amorphous semiconductor film having a thickness of 0.02 to 0.3 $\mu$m, which is made of hydrogenated amorphous silicon, hydrogenated fine crystalline silicon, hydrogenated amorphous silicon containing fluorine, polycrystalline silicon, or the like. Reference numeral 5 represents ohmic contact layers having a thickness of 0.005 to 0.02 $\mu$m, which is made of an N-type hydrogenated amorphous silicon, N-type hydrogenated fine crystalline silicon, or the like. Reference numerals 6 and 7 represent a source electrode and a drain electrode having a thickness of 0.1 to 0.5 $\mu$m, respectively, which are made of chromium, aluminum, ITO, or the like. Reference numeral 8 represents a light-shielding film having a thickness of 0.5 to 3 $\mu$m, which consists of an opaque organic film. The opaque organic film consists of a photoresist as its principal component and a black pigment is dissolved in the photoresist as the opaque material. The photoresist in the embodiment is a positive type resist made essentially of phenol resin and quinonediazide or the like. As the black pigment, carbon or the like may be utilized. Therefore, when forming the light-shielding film 8 as an opaque organic film, the opaque organic film is coated by use of a spin coater or the like after the source and drain electrodes 6 and 7 are formed. Next, the opaque organic film is patterned in such a manner as to bridge across the source and drain electrodes 6 and 7.

Figure 3:
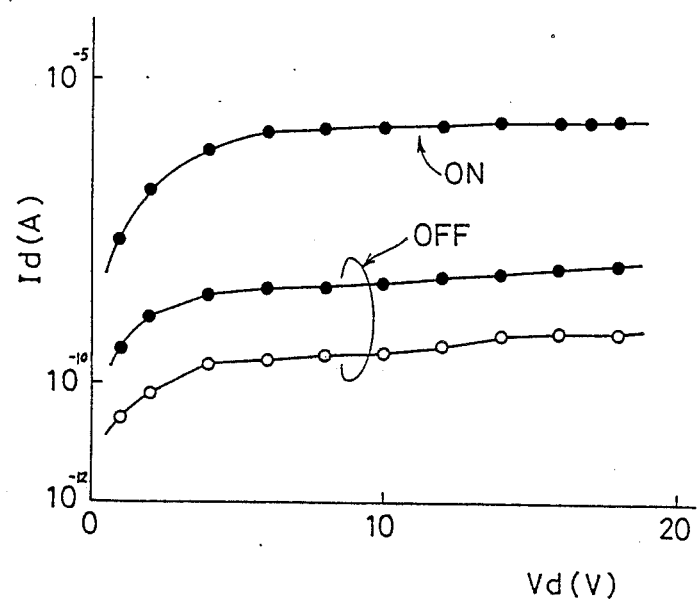
FIG. 3 is an electric characteristic diagram of a TFT according to the present invention.

FIG. 3 is a diagram showing electric characteristics of the TFT thus fabricated. In FIG. 3, the X-axis represents a drain voltage (Vd) and the Y-axis represents a drain current (Id). Black circles show the electric characteristics of the TFT having no light-shielding layer. White circles show the electric characteristics of the TFT having an opaque organic light-shielding layer of about 1.5 $\mu$m thickness. In both cases, the thickness of the amorphous semiconductor film 4 is about 2000 Å. Symbol ON represents the ON current condition (gate voltage: 20 V) when light is incident on the TFT. Since the black circles and white circles are in agreement with one another in this case, the white circles are omitted.

On the other hand, symbol OFF represents the OFF current condition (gate voltage: 0 V) when light is incident on the TFT. In comparison with the black circles, the white circles are significantly lower. It can be understood from this fact that the opaque organic film plays the role of shading the incident light from the TFT.

In the foregoing description, the opaque organic light-shielding layer 8 is utilized for an inverted staggered structure type TFT as shown in FIG. 1. However, the opaque organic light-shielding layer 8 may be utilized for another type TFT such as an inverted coplaner structure type TFT.

As described above, since the light-shielding film 8 of the TFT in accordance with the present invention is formed by the opaque organic film, the TFT of the present invention can be fabricated more easily than a TFT whose light-shielding film 8 is formed by an amorphous insulating film consisting principally of germanium. Moreover, the present invention provides another effect in that toxic gas such as germane, silane or the like need not be used.

What is claimed is:

1. A thin film transistor comprising: an insulating substrate, a gate electrode disposed on the insulating substrate, a gate insulating film disposed on the gate electrode and the insulating substrate, an amorphous semiconductor film disposed on the gate insulating film, a source electrode and a drain electrode disposed in spaced relation to each other on the amorphous semiconductor film, and a light-shielding film disposed on the source electrode, the drain electrode and the amorphous semiconductor film for reducing optical leakage current, the light-shielding film being composed essentially of photoresist material containing black carbon.

2. A thin film transistor according to claim 1; wherein the amorphous semiconductor film has a thickness of 0.02 to 0.3 μm.

3. A thin film transistor according to claim 1; wherein the source electrode and the drain electrode are disposed on the amorphous semiconductor film through respective ohmic contact layers.

4. A thin film transistor according to claim 3; wherein each of the ohmic contact layers comprises an N-type hydrogenated amorphous silicon.

5. A thin film transistor according to claim 3; wherein each of the ohmic contact layers comprises an N-type hydrogenated fine crystalline silicon.

6. A thin film transistor according to claim 3; wherein each of the ohmic contact layers has a thickness of 0.005 to 0.02 μm.

7. A thin film transistor comprising: an insulating substrate; a gate electrode disposed on the insulating substrate; a gate insulating film disposed on the gate electrode and the insulating substrate; an amorphous semiconductor film disposed on the gate insulating film; two ohmic contact layers disposed in spaced relation to each other on the amorphous semiconductor layer; a source electrode and a drain electrode disposed on the respective ohmic contact layers; and an opaque organic light-shielding film disposed on the source electrode, the drain electrode and the amorphous semiconductor film for reducing optical leakage current, the light-shielding film being composed essentially of photoresist material containing black carbon.

8. A thin film transistor according to claim 7; wherein the light-shielding layer has a thickness of 0.5 to 3 μm.

9. A thin film transistor according to claim 7; wherein the photoresist material comprises phenol resin and quinone-diazide.

10. A thin film transistor according to claim 7; wherein the photoresist material comprises a positive type photoresist material.

* * * * *